(12) United States Patent
Ikeda et al.

(10) Patent No.: US 12,471,418 B2
(45) Date of Patent: Nov. 11, 2025

(54) DISPLAY DEVICE

(71) Applicant: Japan Display Inc., Tokyo (JP)

(72) Inventors: Masanobu Ikeda, Tokyo (JP); Yoshinori Tanaka, Tokyo (JP); Jin Hirosawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 655 days.

(21) Appl. No.: 17/860,731

(22) Filed: Jul. 8, 2022

(65) Prior Publication Data

US 2023/0014363 A1 Jan. 19, 2023

(30) Foreign Application Priority Data

Jul. 13, 2021 (JP) ................................ 2021-115819

(51) Int. Cl.
*H01L 33/58* (2010.01)
*H10H 20/855* (2025.01)
*H10H 29/14* (2025.01)

(52) U.S. Cl.
CPC ........ *H10H 20/855* (2025.01); *H10H 29/142* (2025.01)

(58) Field of Classification Search
CPC ..... H10H 29/142; H10H 20/851–8516; H10H 20/855–856; H01L 25/167; H01L 25/0753; H10F 39/806–8067; H10K 50/85–865

See application file for complete search history.

(56) References Cited

U.S. PATENT DOCUMENTS

| | | | |
|---|---|---|---|
| 2007/0091602 A1* | 4/2007 | van Voorst Vader | G03B 15/05 362/11 |
| 2008/0239499 A1 | 10/2008 | Fukada | |
| 2015/0260368 A1* | 9/2015 | Enomoto | F21V 5/007 362/235 |
| 2019/0043844 A1 | 2/2019 | Liu et al. | |
| 2020/0075666 A1* | 3/2020 | Kawaguchi | H10H 29/142 |
| 2021/0098527 A1 | 4/2021 | Ikeda et al. | |

(Continued)

FOREIGN PATENT DOCUMENTS

| | | |
|---|---|---|
| CN | 111883684 A | 11/2020 |
| GB | 2564588 A | 1/2019 |
| JP | 2004-227940 A | 8/2004 |

(Continued)

OTHER PUBLICATIONS

Japanese Notice of Reasons for Refusal from corresponding Japanese Patent Application No. 2021-115819, issued Mar. 25, 2025. 12 pages.

(Continued)

*Primary Examiner* — Cuong B Nguyen
(74) *Attorney, Agent, or Firm* — K&L Gates LLP

(57) ABSTRACT

A display device includes a substrate, a plurality of first light-emitting elements and a plurality of second light-emitting elements provided in a display region of the substrate, a first lens provided overlapping each of the first light-emitting elements and having a first diameter in planar view seen from a direction perpendicular to the substrate, and a second lens provided overlapping each of the second light-emitting elements and having a second diameter smaller than the first diameter in planar view seen from the direction perpendicular to the substrate.

9 Claims, 12 Drawing Sheets

(56) References Cited

U.S. PATENT DOCUMENTS

2023/0180585 A1  6/2023 Xia

FOREIGN PATENT DOCUMENTS

| JP | 2007086500 A | 4/2007 |
| JP | 2011-065773 A | 3/2011 |
| JP | 2021056380 A | 4/2021 |

OTHER PUBLICATIONS

Office Action issued in related Chinese Patent Application No. 202210746807.4, issued Jul. 31, 2025 and English translation of same. 12 pages.

* cited by examiner

DISPLAY DEVICE

CROSS-REFERENCE TO RELATED APPLICATION

This application claims the benefit of priority from Japanese Patent Application No. 2021-115819 filed on Jul. 13, 2021, the entire contents of which are incorporated herein by reference.

BACKGROUND

1. Technical Field

The present disclosure relates to a display device.

2. Description of the Related Art

Display devices including micro-sized light-emitting diodes (micro LEDs) as display elements have been attracting attention (refer to Japanese Patent Application Laid-open Publication No. 2021-56380 (JP-A-2021-56380), for example). JP-A-2021-56380 describes a technology for changing the distribution of output light in a display region by mounting light-emitting elements on an array substrate in an inclined manner. The display device described in Japanese Patent Application Laid-open Publication No. 2007-86500 (JP-A-2007-86500) includes a plurality of microlenses arrayed on a predetermined curved surface in a manner facing respective pixels of the display device.

Displays with micro-sized light-emitting diodes are expected to have suitable display characteristics, such as high viewing angle and high luminance. The technology described in JP-A-2021-56380 may possibly complicate the process of transferring the light-emitting elements to the array substrate. In the display device described in JP-A-2007-86500, the microlenses are disposed so as to converge light output from them on the eye. As a result, the display device can provide higher luminance in the front direction, but it may possibly provide lower luminance in directions other than the front direction.

SUMMARY

A display device according to an embodiment of the present disclosure includes a substrate, a plurality of first light-emitting elements and a plurality of second light-emitting elements provided in a display region of the substrate, a first lens provided overlapping each of the first light-emitting elements and having a first diameter in planar view seen from a direction perpendicular to the substrate, and a second lens provided overlapping each of the second light-emitting elements and having a second diameter smaller than the first diameter in planar view seen from the direction perpendicular to the substrate.

DETAILED DESCRIPTION

Figure 1:
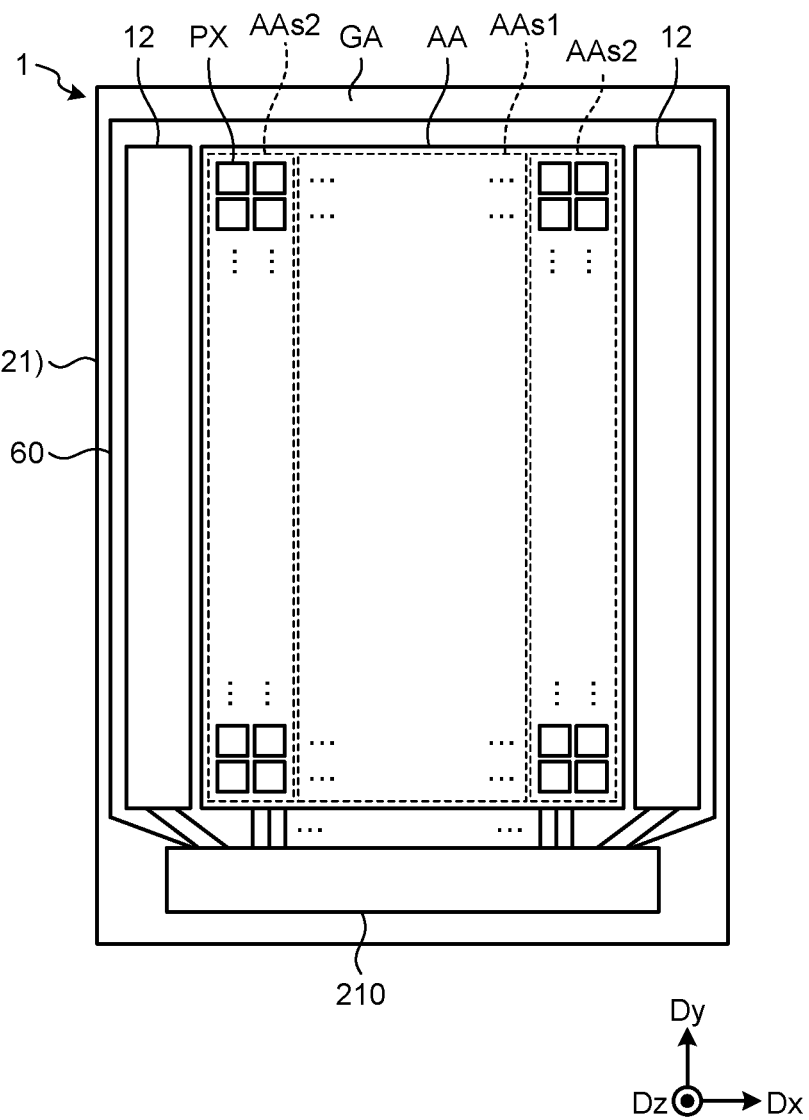
FIG. 1 is a plan view schematically illustrating a display device according to a first embodiment.

Exemplary aspects (embodiments) to embody the present disclosure are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by like reference numerals, and detailed explanation thereof may be appropriately omitted.

To describe an aspect where a first structure is disposed on a second structure in the present specification and the claims, the term "on" includes both of the following cases unless otherwise noted: a case where the first structure is disposed directly on the second structure in contact with the second structure, and a case where the first structure is disposed on the second structure with another structure interposed therebetween.

First Embodiment

FIG. 1 is a plan view schematically illustrating a display device according to a first embodiment. As illustrated in FIG. 1, a display device 1 includes an array substrate 2, pixels PX, drive circuits 12, a drive integrated circuit (IC)

210, and cathode wiring 60. The array substrate 2 is a drive circuit substrate that drives the pixels PX and is also called a backplane or an active matrix substrate. The array substrate 2 includes a substrate 21, a plurality of transistors, a plurality of capacitances, various kinds of wiring, and other components.

As illustrated in FIG. 1, the display device 1 has a display region AA and a peripheral region GA. The display region AA is disposed overlapping the pixels PX and displays an image. The peripheral region GA does not overlap the pixels PX and is positioned outside the display region AA.

The pixels PX are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, plan view indicates the positional relation viewed from the third direction Dz.

In the display device 1 according to the first embodiment, the display region AA includes a first region AAs1 and a plurality of second regions AAs2. The first region AAs1 is positioned at the center of the display region AA in the first direction Dx. The second regions AAs2 are positioned at the outer ends of the display region AA in the first direction Dx and are provided along the sides extending in the second direction Dy of the display region AA. The first region AAs1 is provided between the second regions AAs2 in the first direction Dx. In the display region AA, the second region AAs2, the first region AAs1, and the second region AAs2 are arranged in this order in the first direction Dx.

The arrangement of the first region AAs1 and the second regions AAs2 illustrated in FIG. 1 is given by way of example only and may be appropriately modified according to the display characteristics (e.g., viewing angle and luminance) required for the display device 1. The second regions AAs2, for example, may be provided along one side of the display region AA or along four sides of the display region AA in a manner surrounding the first region AAs1. While the pixels PX are illustrated in only part of the display region AA in FIG. 1, the pixels PX are disposed in a matrix (row-column configuration) over the first region AAs1 and the second regions AAs2.

The drive circuits 12 drive a plurality of gate lines (e.g., a reset control signal line L5, an output control signal line L6, a pixel control signal line L7, and an initialization control signal line L8 (refer to FIG. 3)) based on various control signals supplied via wiring extending from the drive IC 210. The drive circuits 12 sequentially or simultaneously select a plurality of gate lines and supply gate drive signals to the selected gate lines. As a result, the drive circuits 12 select the pixels PX coupled to the gate lines.

The drive IC 210 is a circuit that controls display on the display device 1. A plurality of wires extend from the drive IC 210 toward the pixels PX (e.g., a video signal line L2, a reset power supply line L3, and an initialization power supply line L4 (refer to FIG. 3)). The drive IC 210 is mounted on the peripheral region GA of the substrate 21 as chip on glass (COG). The mounting form of the drive IC 210 is not limited thereto, and the drive IC 210 may be mounted on a flexible printed circuit board or a rigid circuit board coupled to the peripheral region GA of the substrate 21.

The cathode wiring 60 is provided in the peripheral region GA of the substrate 21. The cathode wiring 60 is provided surrounding the pixels PX in the display region AA and the drive circuits 12 in the peripheral region GA. Cathodes of a plurality of light-emitting elements 3 are coupled to the common cathode wiring 60 and are supplied with a fixed potential (e.g., a ground potential). More specifically, a cathode electrode 32 (refer to FIG. 4) of the light-emitting element 3 is coupled to the cathode wiring 60 via a counter cathode electrode 22 (refer to FIG. 4) provided on the array substrate 2.

Figure 2:
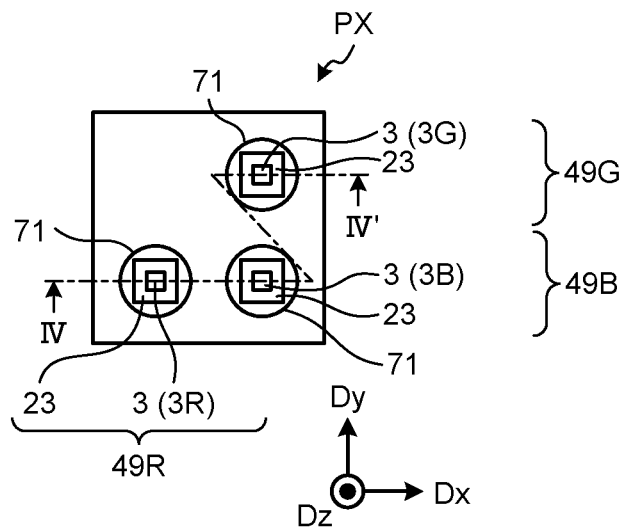
FIG. 2 is a plan view of a plurality of pixels.

FIG. 2 is a plan view of a plurality of pixels. As illustrated in FIG. 2, one pixel PX includes a plurality of sub-pixels 49. The pixel PX includes a sub-pixel 49R, a sub-pixel 49G, and a sub-pixel 49B, for example. The sub-pixel 49R displays a primary color of red as the first color. The sub-pixel 49G displays a primary color of green as the second color. The sub-pixel 49B displays a primary color of blue as the third color. As illustrated in FIG. 2, the sub-pixel 49R and the sub-pixel 49B are adjacently disposed in the first direction Dx in one pixel PX. The sub-pixel 49B and the sub-pixel 49G are adjacently disposed in the second direction Dy. The first color, the second color, and the third color are not limited to red, green, and blue, respectively, and may be any desired colors, such as complementary colors. In the following description, the sub-pixel 49R, the sub-pixel 49G, and the sub-pixel 49B are simply referred to as the sub-pixels 49 when they need not be distinguished from one another.

Each sub-pixel 49 includes the light-emitting element 3 and an anode coupling electrode 23. A first lens 71 (or second lenses 72 (refer to FIG. 5)) is provided overlapping the light-emitting element 3. The display device 1 displays an image by outputting different lights from the light-emitting elements 3R, 3G, and 3B in the sub-pixels 49R, 49G, and 49B, respectively. The light-emitting element 3 is an inorganic light-emitting diode (LED) chip having a size of approximately 3 µm to 300 µm in planar view and is called a micro LED. The display device 1 including micro LEDs in respective pixels is also called a micro LED display device. The term "micro" of the micro LED is not intended to limit the size of the light-emitting element 3.

The configuration of the light-emitting element 3 and the first lens 71 will be described later in greater detail. The light-emitting elements 3 may output different light in four or more colors. The arrangement of the sub-pixels 49 is not limited to the configuration illustrated in FIG. 2. The sub-pixel 49R and the sub-pixel 49G, for example, may be adjacently disposed in the second direction Dy. The sub-pixels 49R, 49G, and 49B may be repeatedly arrayed in this order in the first direction Dx.

Figure 3:
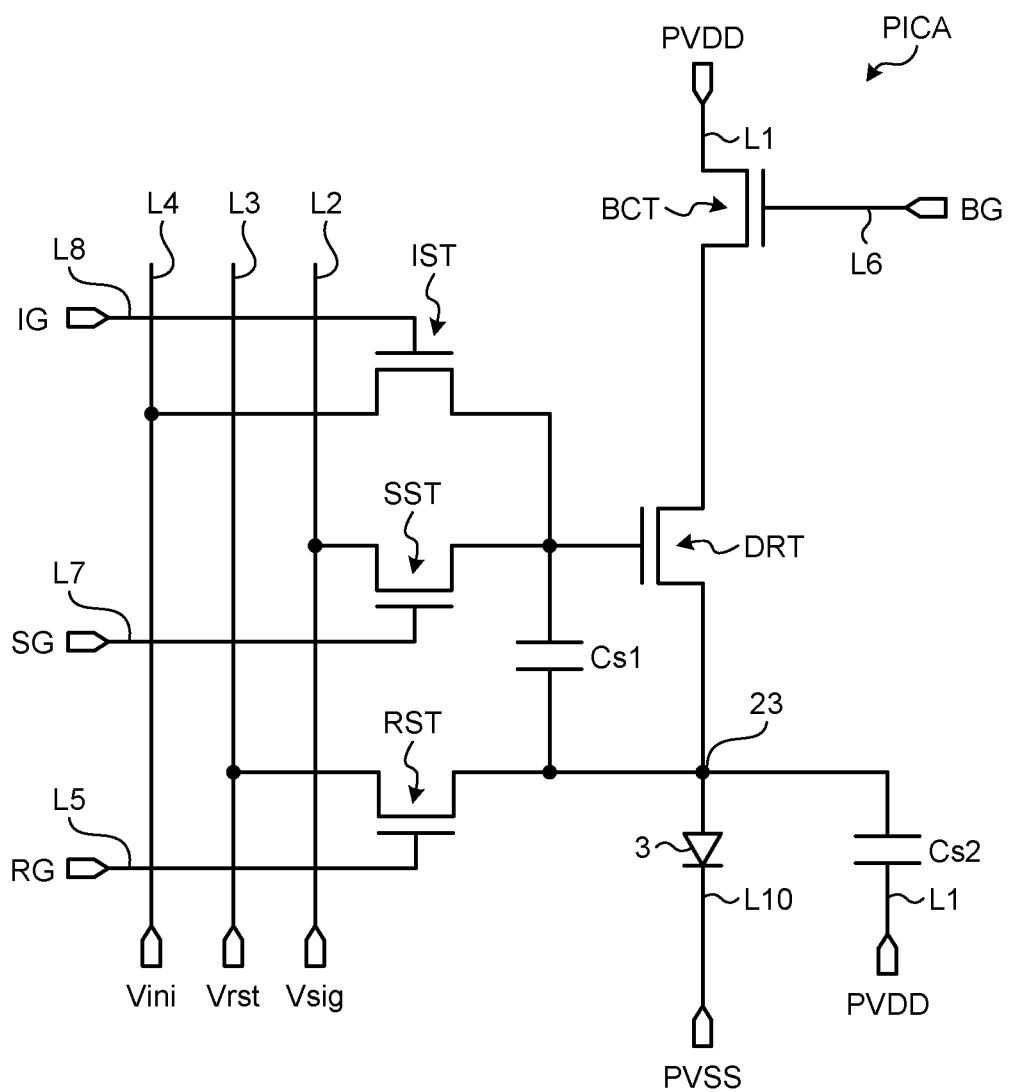
FIG. 3 is a circuit diagram of a pixel circuit.

FIG. 3 is a circuit diagram of a pixel circuit. FIG. 3 illustrates a pixel circuit PICA provided to one sub-pixel 49, and a plurality of pixel circuits PICA are provided to the respective sub-pixels 49. As illustrated in FIG. 3, the pixel circuit PICA includes the light-emitting element 3, five transistors, and two capacitances. Specifically, the pixel circuit PICA includes a drive transistor DRT, an output transistor BCT, an initialization transistor IST, a pixel selection transistor SST, and a reset transistor RST. The drive transistor DRT, the output transistor BCT, the initialization transistor IST, the pixel selection transistor SST, and the reset transistor RST are n-type thin-film transistors (TFTs). The pixel circuit PICA includes first capacitance Cs1 and second capacitance Cs2.

The cathode (cathode electrode 32) of the light-emitting element 3 is coupled to a cathode power supply line L10. An anode (anode electrode 33) of the light-emitting element 3 is coupled to an anode power supply line L1 via the anode coupling electrode 23, the drive transistor DRT, and the output transistor BCT. The anode power supply line L1 is supplied with an anode power supply potential PVDD. The cathode power supply line L10 is supplied with a cathode power supply potential PVSS via the cathode wiring 60 and the cathode electrode 32. The anode power supply potential PVDD is higher than the cathode power supply potential PVSS.

The anode power supply line L1 supplies the anode power supply potential PVDD serving as a drive potential to the sub-pixel 49. Specifically, the light-emitting element 3 ideally emits light by being supplied with a forward current (drive current) due to the potential difference between the anode power supply potential PVDD and the cathode power supply potential PVSS (PVDD-PVSS). In other words, the anode power supply potential PVDD has a potential difference for causing the light-emitting element 3 to emit light with respect to the cathode power supply potential PVSS. The anode electrode 33 of the light-emitting element 3 is electrically coupled to the anode coupling electrode 23, and the second capacitance Cs2 is formed between the anode coupling electrode 23 and the anode power supply line L1.

The source electrode of the drive transistor DRT is coupled to the anode electrode 33 of the light-emitting element 3 via the anode coupling electrode 23, and the drain electrode thereof is coupled to the source electrode of the output transistor BCT. The gate electrode of the drive transistor DRT is coupled to the first capacitance Cs1, the drain electrode of the pixel selection transistor SST, and the drain electrode of the initialization transistor IST.

The gate electrode of the output transistor BCT is coupled to the output control signal line L6. The output control signal line L6 is supplied with output control signals BG. The drain electrode of the output transistor BCT is coupled to the anode power supply line L1.

The source electrode of the initialization transistor IST is coupled to the initialization power supply line L4. The initialization power supply line L4 is supplied with an initialization potential Vini. The gate electrode of the initialization transistor IST is coupled to the initialization control signal line L8. The initialization control signal line L8 is supplied with initialization control signals IG. In other words, when the initialization transistor IST is turned on, the gate electrode of the drive transistor DRT is coupled to the initialization power supply line L4 via the initialization transistor IST.

The source electrode of the pixel selection transistor SST is coupled to the video signal line L2. The video signal line L2 is supplied with video signals Vsig. The gate electrode of the pixel selection transistor SST is coupled to the pixel control signal line L7. The pixel control signal line L7 is supplied with pixel control signals SG.

The source electrode of the reset transistor RST is coupled to the reset power supply line L3. The reset power supply line L3 is supplied with a reset power supply potential Vrst. The gate electrode of the reset transistor RST is coupled to the reset control signal line L5. The reset control signal line L5 is supplied with reset control signals RG. The drain electrode of the reset transistor RST is coupled to the anode coupling electrode 23 (anode electrode 33 of the light-emitting element 3) and the source electrode of the drive transistor DRT. A reset operation performed by the reset transistor RST resets the voltage held in the first capacitance Cs1 and the second capacitance Cs2.

The first capacitance Cs1 is formed between the drain electrode of the reset transistor RST and the gate electrode of the drive transistor DRT. With the first capacitance Cs1 and the second capacitance Cs2, the pixel circuit PICA can suppress fluctuations in the gate voltage due to parasitic capacitance and leakage current in the drive transistor DRT.

In the following description, the anode power supply line L1 and the cathode power supply line L10 may be simply referred to as power supply lines. The video signal line L2, the reset power supply line L3, and the initialization power supply line L4 may be referred to as signal lines. The reset control signal line L5, the output control signal line L6, the pixel control signal line L7, and the initialization control signal line L8 may be referred to as gate lines.

The gate electrode of the drive transistor DRT is supplied with an electric potential corresponding to the video signal Vsig (or a gradation signal). In other words, the drive transistor DRT supplies an electric current corresponding to the video signal Vsig to the light-emitting element 3 based on the anode power supply potential PVDD supplied via the output transistor BCT. As described above, the anode power supply potential PVDD supplied to the anode power supply line L1 is lowered by the drive transistor DRT and output transistor BCT. As a result, the anode electrode 33 of the light-emitting element 3 is supplied with an electric potential lower than the anode power supply potential PVDD.

A first electrode of the second capacitance Cs2 is supplied with the anode power supply potential PVDD via the anode power supply line L1, and a second electrode of the second capacitance Cs2 is supplied with an electric potential lower than the anode power supply potential PVDD. In other words, the first electrode of the second capacitance Cs2 is supplied with a higher potential than the second electrode of the second capacitance Cs2. The first electrode of the second capacitance Cs2 is a counter electrode 25 coupled to the anode power supply line L1 illustrated in FIG. 4, for example, and the second electrode of the second capacitance Cs2 is the anode coupling electrode 23 coupled to the source of the drive transistor DRT illustrated in FIG. 4.

In the display device 1, the drive circuits 12 (illustrated in FIG. 1) select a plurality of pixel rows in order from the first row (e.g., the uppermost pixel row in the display region AA in FIG. 1). The drive IC 210 writes the video signals Vsig (video writing potential) to the sub-pixels 49 of the selected pixel row, thereby causing the light-emitting elements 3 to emit light. The drive IC 210 supplies the video signals Vsig to the video signal line L2, supplies the reset power supply potential Vrst to the reset power supply line L3, and supplies the initialization potential Vini to the initialization power supply line L4 in each horizontal scanning period. The display device 1 repeats these operations for each image of one frame.

Figure 4:
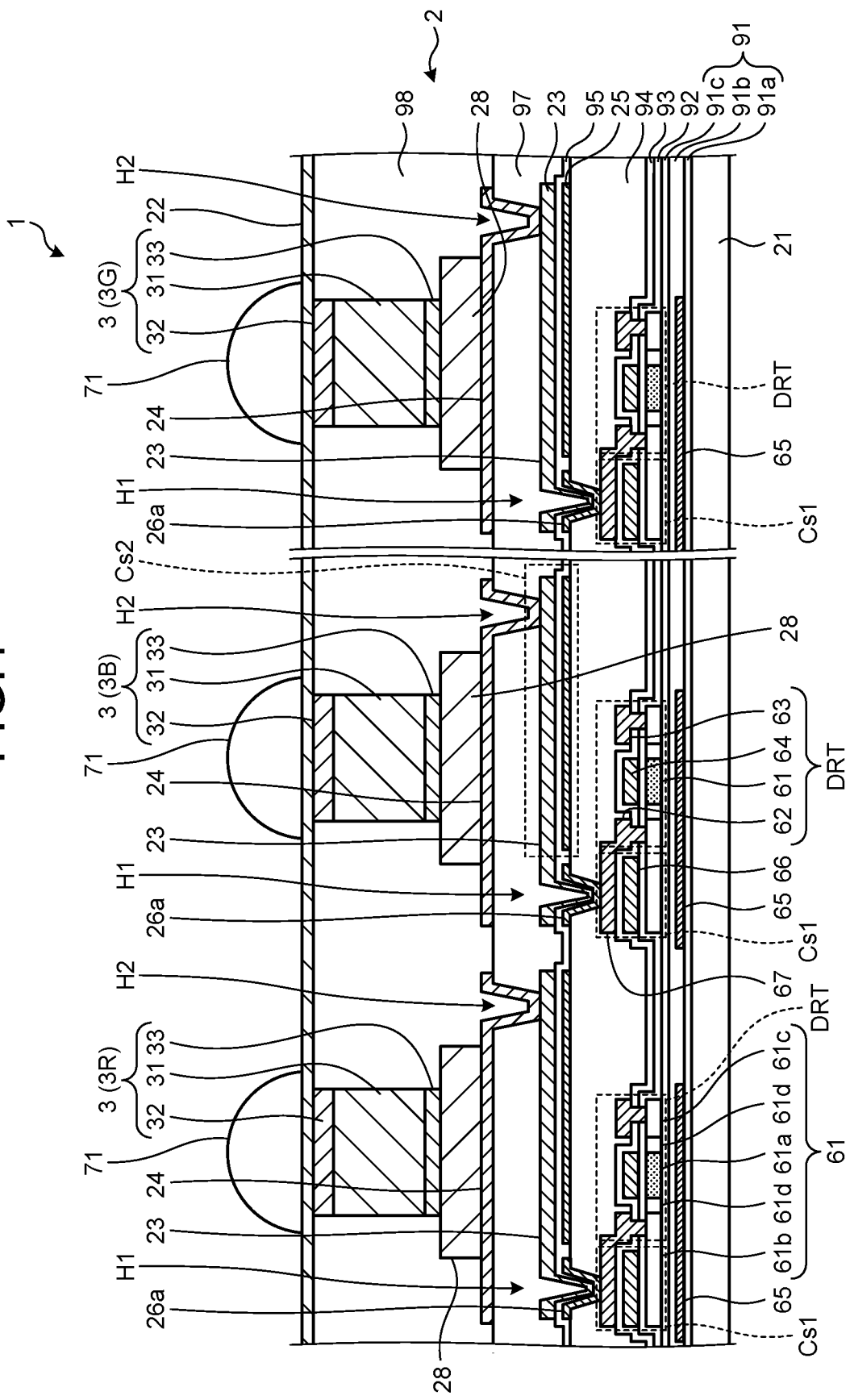
FIG. 4 is a sectional view along line IV-IV' of FIG. 2.

The following describes a sectional configuration of the display device 1. FIG. 4 is a sectional view along line IV-IV' of FIG. 2. As illustrated in FIG. 4, the light-emitting element 3 is provided on the array substrate 2. The array substrate 2 includes the substrate 21, various transistors, various kinds of wiring, and various insulating films. The substrate 21 is an insulating substrate and is a glass substrate, a resin substrate, or a resin film, for example.

In the present specification, a direction from the substrate 21 toward the light-emitting element 3 in a direction perpendicular to the surface of the substrate 21 is referred to as an "upper side" or simply as "top". A direction from the light-emitting element 3 toward the substrate 21 is referred to as a "lower side" or simply as "bottom".

An undercoat film 91 is provided on the substrate 21. The undercoat film 91 has a three-layered structure including insulating films 91a, 91b, and 91c, for example. The insulating film 91a is a silicon oxide film, the insulating film 91b is a silicon nitride film, and the insulating film 91c is a silicon oxide film.

The configuration of the undercoat film 91 is not limited to that illustrated in FIG. 4. The undercoat film 91, for example, may be a single- or two-layered film or a four-or-more-layered film. If the substrate 21 is a glass substrate, a silicon nitride film may be directly formed on the substrate 21 because silicon nitride films have relatively good adhesion.

A light-blocking film 65 is provided on the insulating film 91a. The light-blocking film 65 is provided between a semiconductor layer 61 and the substrate 21. The light-blocking film 65 can prevent light from entering from the substrate 21 into a channel region 61a of the semiconductor layer 61. Alternatively, the light-blocking film 65 may be made of conductive material and supplied with a predetermined potential to provide a back-gate effect to the drive transistor DRT. The light-blocking film 65 may be provided on the substrate 21, and the insulating film 91a may be provided to cover the light-blocking film 65.

The drive transistor DRT is provided on the undercoat film 91 on a main surface side of the substrate 21. While one drive transistor DRT is illustrated corresponding to the light-emitting element 3 in FIG. 4, the output transistor BCT, the initialization transistor IST, the pixel selection transistor SST, and the reset transistor RST (refer to FIG. 3) included in the pixel circuit PICA have the same multilayered structure as that of the drive transistor DRT.

The semiconductor layer 61 is provided on the undercoat film 91. The semiconductor layer 61 includes a channel region 61a, a source region 61b, a drain region 61c, and a low-concentration impurity region 61d. The low-concentration impurity region 61d is provided between the channel region 61a and the source region 61b and between the channel region 61a and the drain region 61c.

A gate insulating film 92 is provided on the undercoat film 91 to cover the semiconductor layer 61. The gate insulating film 92 is a silicon oxide film, for example. A gate electrode 64 is provided on the gate insulating film 92. First wiring 66 is provided in the same layer as that of the gate electrode 64. The gate electrode 64 and the first wiring 66 are made of molybdenum-tungsten (MoW), for example.

In the example illustrated in FIG. 4, the drive transistor DRT has a top-gate structure in which the gate electrode 64 is provided on the semiconductor layer 61. The present embodiment is not limited thereto, and the drive transistor DRT may have a bottom-gate structure in which the gate electrode 64 is provided under the semiconductor layer 61 or a dual-gate structure in which the gate electrodes 64 are provided both on and under the semiconductor layer 61.

An interlayer insulating film 93 is provided on the gate insulating film 92 to cover the gate electrode 64. The interlayer insulating film 93 has a multilayered structure composed of a silicon nitride film and a silicon oxide film, for example. A source electrode 62 and a drain electrode 63 are provided on the interlayer insulating film 93. The source electrode 62 is coupled to the source region 61b through a contact hole formed in the gate insulating film 92 and the interlayer insulating film 93. The drain electrode 63 is coupled to the drain region 61c through a contact hole formed in the gate insulating film 92 and the interlayer insulating film 93. The source electrode 62 is coupled to second wiring 67 serving as routing wiring. The source electrode 62, the drain electrode 63, and the second wiring 67 may have a three-layered structure of titanium (Ti), aluminum (Al), and titanium (Ti), for example.

Part of the second wiring 67 is formed in a region overlapping the first wiring 66. The first capacitance Cs1 is formed by the first wiring 66 and the second wiring 67 facing each other with the interlayer insulating film 93 interposed therebetween. The first wiring 66 is formed in a region overlapping part of the semiconductor layer 61. The first capacitance Cs1 includes capacitance formed by the semiconductor layer 61 and the first wiring 66 facing each other with the gate insulating film 92 interposed therebetween.

A first organic insulating film 94 is provided on the interlayer insulating film 93 to cover the drive transistor DRT and the second wiring 67. The first organic insulating film 94 is made of organic material, such as photosensitive acrylic. The organic material, such as photosensitive acrylic, is excellent in coverability for covering a difference in level of wiring and flatness on the surface compared with inorganic insulating material formed by chemical vapor deposition (CVD), for example.

The counter electrode 25, a capacitance insulating film 95, and the anode coupling electrode 23 are stacked in this order on the first organic insulating film 94. The counter electrode 25 is made of translucent conductive material, such as indium tin oxide (ITO). The counter electrode 25 is coupled to the anode power supply line L1 (refer to FIG. 3) at the bottom of a contact hole formed in the first organic insulating film 94, which is not illustrated in FIG. 4. A coupling electrode 26a is provided in the same layer as that of the counter electrode 25. The coupling electrode 26a is provided to cover the inside of a contact hole H1 formed in the first organic insulating film 94 and is coupled to the second wiring 67 at the bottom of the contact hole H1.

The capacitance insulating film 95 is provided to cover the counter electrode 25 and the coupling electrode 26a and has an opening in the region overlapping the contact hole H1. The capacitance insulating film 95 is a silicon nitride film, for example. The anode coupling electrode 23 faces the counter electrode 25 with the capacitance insulating film 95 interposed therebetween. The anode coupling electrode 23 is electrically coupled to the coupling electrode 26a and the second wiring 67 through the contact hole H1. As a result, the anode coupling electrode 23 is electrically coupled to the drive transistor DRT.

The anode coupling electrode 23 has a multilayered structure of titanium (Ti) and aluminum (Al), for example. The embodiment is not limited thereto, and the anode coupling electrode 23 may be made of material including at least one of metals of molybdenum (Mo) and Ti. Alternatively, the anode coupling electrode 23 may be made of alloy including at least one of Mo and Ti or translucent conductive material. The second capacitance Cs2 is formed between the anode coupling electrode 23 and the counter electrode 25 facing each other with the capacitance insulating film 95 interposed therebetween.

A second organic insulating film 97 is provided on the anode coupling electrode 23. The second organic insulating film 97 is made of the same organic material as that of the first organic insulating film 94. A mounting electrode 24 is provided on the second organic insulating film 97 and is electrically coupled to the anode coupling electrode 23 through a contact hole H2. Similarly to the anode coupling electrode 23, the mounting electrode 24 has a multilayered structure of Ti and Al. The mounting electrode 24 may be made of conductive material different from that of the anode coupling electrode 23. The second organic insulating film 97 may be made of organic material different from that of the first organic insulating film 94.

The light-emitting elements 3R, 3G, and 3B are mounted on the respective mounting electrodes 24. Each light-emitting element 3 is mounted with the anode electrode 33 in contact with the mounting electrode 24. A bonding member 28 between the anode electrode 33 of the light-emitting element 3 and the mounting electrode 24 is not particularly limited as long as it can secure satisfactory continuity between them and does not damage the objects formed on the array substrate 2. The bonding member 28 is made of solder or conductive paste, for example. Examples of the method for bonding the anode electrode 33 and the mounting electrode 24 include, but are not limited to, a method of ref lowing using low-temperature melting soldering material, a method of placing the light-emitting element 3 on the array substrate 2 with conductive paste interposed therebetween and sintering them, etc.

The light-emitting element 3 includes a semiconductor layer 31, the cathode electrode 32, and the anode electrode 33. The semiconductor layer 31 may have a configuration in which an n-type cladding layer, an active layer, and a p-type cladding layer are stacked. The semiconductor layer 31 is made of a compound semiconductor, such as gallium nitride (GaN), aluminum indium phosphide (AlInP), and indium gallium nitride (InGaN). The semiconductor layer 31 may be made of different materials depending on the light-emitting elements 3R, 3G, and 3B. The active layer may have a multi-quantum well structure (MQW structure) in which well layers and barrier layers composed of several atomic layers are cyclically stacked for high efficiency.

An element insulating film 98 is provided between the light-emitting elements 3. The element insulating film 98 is made of resin material. The element insulating film 98 covers at least the side surfaces of the light-emitting elements 3, and the cathode electrodes 32 of the light-emitting elements 3 are exposed from the element insulating film 98. The element insulating film 98 is formed flat such that the upper surface of the element insulating film 98 and the upper surfaces of the cathode electrodes 32 form the same plane. The position of the upper surface of the element insulating film 98 may be different from that of the upper surfaces of the cathode electrodes 32.

The counter cathode electrode 22 covers the light-emitting elements 3 and the element insulating film 98 and is electrically coupled to the light-emitting elements 3. The counter cathode electrode 22 is made of translucent conductive material, such as ITO. Therefore, the counter cathode electrode 22 can efficiently extract light output from the light-emitting elements 3 to the outside. The counter cathode electrode 22 is electrically coupled to the cathode electrodes 32 of the light-emitting elements 3 mounted on the display region AA. The counter cathode electrode 22 is coupled to the cathode wiring 60 (refer to FIG. 1) provided on the array substrate 2 at a contact part provided outside the display region AA.

The first lenses 71 are provided overlapping the respective light-emitting elements 3. The first lens 71 and the second lens 72 (refer to FIG. 5) are optical members for adjusting the illuminance distribution of light output from the light-emitting elements 3 and are also called microlenses. The configuration of the light-emitting elements 3, the first lenses 71, and the second lenses 72 will be described later with reference to FIG. 5 and subsequent figures.

As described above, the display device 1 provided with the light-emitting elements 3 as the display elements is configured. The display device 1 may include an overcoat layer or a cover substrate stacked on the counter cathode electrode 22, the first lenses 71, and the second lenses 72 as necessary. The display device 1 may further include a circularly polarizing plate, a touch panel, and other components on the counter cathode electrode 22.

FIG. 4 illustrates a face-up structure in which the upper part of the light-emitting element 3 is coupled to the counter cathode electrode 22. The embodiment is not limited thereto, and the light-emitting element 3 may be a flip-chip light-emitting element in which the anode electrode 33 (p-type electrode) and the cathode electrode 32 (n-type electrode) are provided on the same surface facing the array substrate 2.

Figure 5:
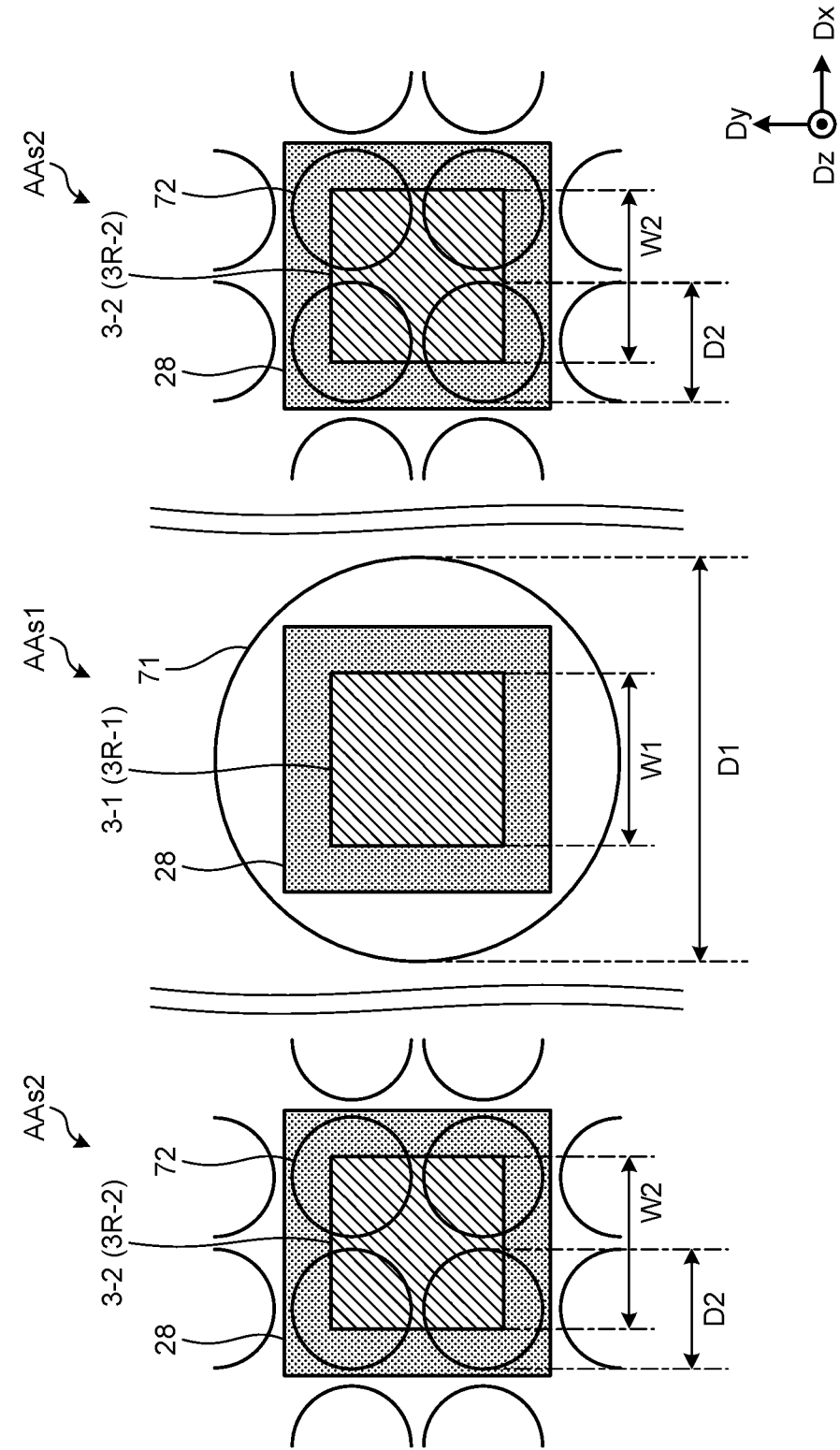
FIG. 5 is a plan view schematically illustrating a first light-emitting element, a first lens, second light-emitting elements, and second lenses.
Figure 6:
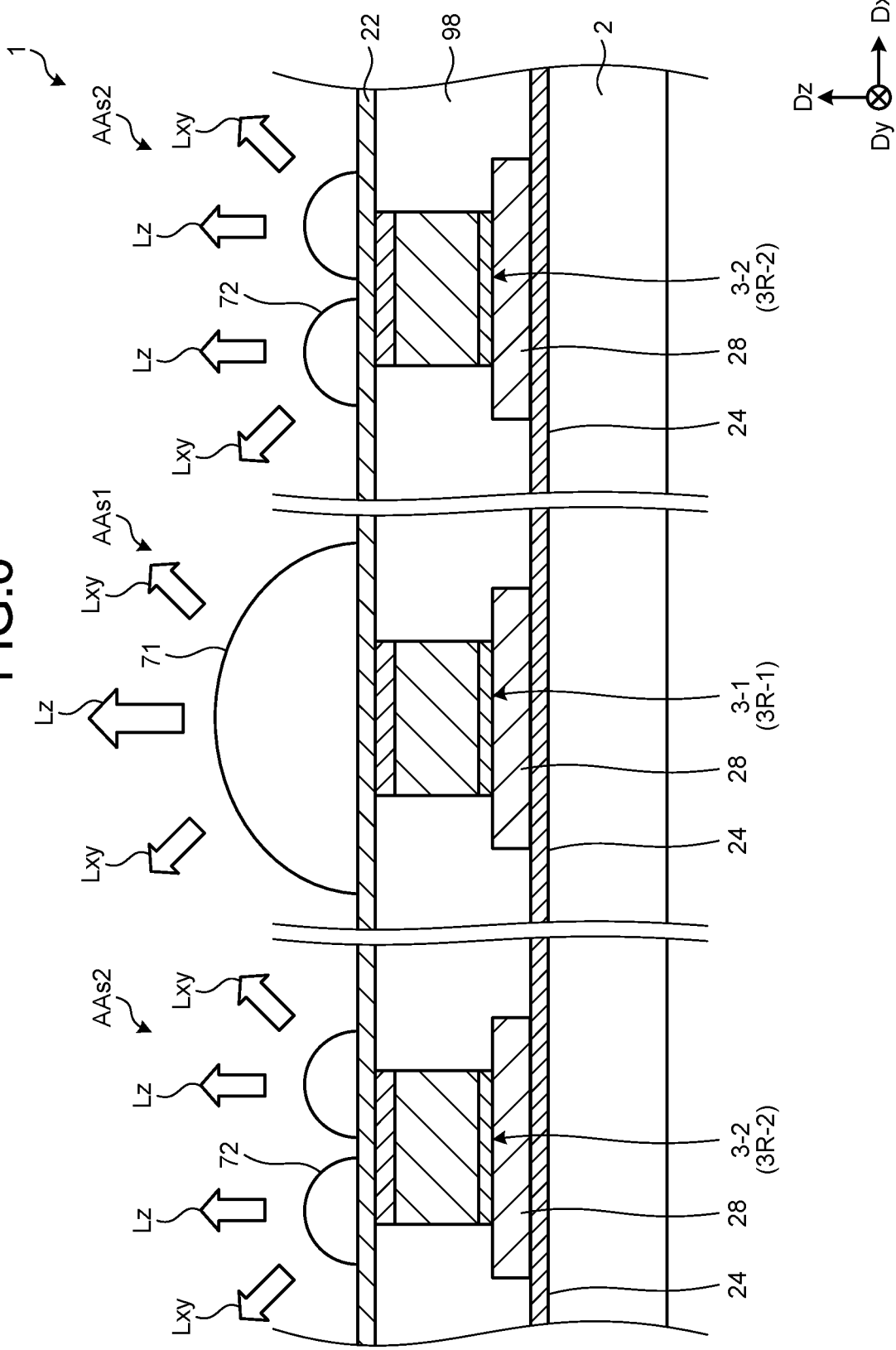
FIG. 6 is a sectional view schematically illustrating the first light-emitting element, the first lens, the second light-emitting elements, and the second lenses.

FIG. 5 is a plan view schematically illustrating a first light-emitting element, a first lens, second light-emitting elements, and second lenses. FIG. 6 is a sectional view schematically illustrating the first light-emitting element, the first lens, the second light-emitting elements, and the second lenses. FIGS. 5 and 6 are enlarged schematics of part of the second region AAs2, the first region AAs1, and the second region AAs2 adjacently arranged in the first direction Dx in the display region AA of the substrate 21. FIGS. 5 and 6 illustrate the light-emitting elements 3R in an enlarged manner out of the light-emitting elements 3R, 3G, and 3B included in the pixels PX. The description of the light-emitting elements 3R is also applicable to the light-emitting elements 3G and 3B. FIG. 6 does not illustrate the configuration of the array substrate 2 in detail.

As illustrated in FIGS. 5 and 6, the first region AAs1 is provided with a first light-emitting element 3-1 (first light-emitting element 3R-1) and the first lens 71. The second region AAs2 is provided with a second light-emitting element 3-2 (second light-emitting element 3R-2) and the second lenses 72. In the following description, the light-emitting element 3 mounted in the first region AAs1 out of the light-emitting elements 3 is referred to as the first light-emitting element 3-1, and the light-emitting element 3 mounted in the second region AAs2 is referred to as the second light-emitting element 3-2. The first light-emitting element 3-1 and the second light-emitting element 3-2 are elements made of the same material and having the same multilayered configuration.

The first lens 71 is provided overlapping the first light-emitting element 3-1. The second lens 72 is provided overlapping the second light-emitting element 3-2. The first lens 71 and the second lens 72 are provided on the element insulating film 98 and the counter cathode electrode 22 covering the first light-emitting element 3-1 and the second light-emitting element 3-2. The first lens 71 and the second lens 72 are provided in the same layer. A protective film or the like made of insulating material may be provided between the first lens 71 and the second lens 72, and the counter cathode electrode 22.

As illustrated in FIG. 5, the first lens 71 in the first region AAs1 has a first diameter D1 in planar view. The first diameter D1 of the first lens 71 is larger than a first width W1 of the first light-emitting element 3-1 in the first direction Dx. One first lens 71 is provided overlapping one first light-emitting element 3-1. The center (optical axis) of the first lens 71 overlaps the geometric center of the first light-emitting element 3-1 in planar view.

The second lens 72 in the second region AAs2 has a second diameter D2 in planar view. The second diameter D2 of the second lens 72 is smaller than a second width W2 of the second light-emitting element 3-2 in the first direction Dx. The second diameter D2 of the second lens 72 is smaller than the first diameter D1 of the first lens 71. Four second lenses 72 are provided overlapping one second light-emitting element 3-2. The centers (optical axes) of the four second lenses 72 are arranged surrounding the geometric center of the second light-emitting element 3-2 in planar view.

The first width W1 of the first light-emitting element 3-1 and the second width W2 of the second light-emitting element 3-2 are the widths in the first direction Dx of the upper surfaces of the respective semiconductor layers 31 (the surfaces facing the first lens 71 and the second lenses 72), for example.

As illustrated in FIG. 6, light output from the first light-emitting element 3-1 in the first region AAs1 is collected by the first lens 71. As a result, the intensity of light Lz traveling in the third direction Dz is higher than that of light Lxy traveling in directions other than the third direction Dz. In the first region AAs1, the first lenses 71 are provided overlapping the respective first light-emitting elements 3-1. Thus, the luminance in the third direction Dz, that is, in the front direction of the display device 1 is improved as a whole in the first region AAs1.

In the second region AAs2, light output from the second light-emitting element 3-2 is collected by each of the second lenses 72. The intensity of the light Lz traveling in the third direction Dz from the second lenses 72 is lower than that of the light Lz traveling in the third direction Dz from the first lens 71 in the first region AAs1. By contrast, the intensity of the light Lxy traveling in directions other than the third direction Dz from the second lenses 72 is higher than that of the first lens 71. Thus, the luminance in directions inclined with respect to the third direction Dz is improved as a whole, and the viewing angle is secured in the second region AAs2.

As described above, the display device 1 according to the present embodiment includes the substrate 21, the first light-emitting elements 3-1 and the second light-emitting elements 3-2, the first lenses 71, and the second lenses 72. The first light-emitting elements 3-1 and the second light-emitting elements 3-2 are provided in the display region AA of the substrate 21. The first lenses 71 are provided overlapping the respective first light-emitting elements 3-1 and have the first diameter D1 in planar view seen from a direction perpendicular to the substrate 21. The second lenses 72 are provided overlapping the second light-emitting elements 3-2 and have the second diameter D2 smaller than the first diameter D1 in planar view seen from the direction perpendicular to the substrate 21.

In the display device 1 according to the first embodiment, the first diameter D1 (radius of curvature) of the first lens 71 is different from the second diameter D2 (radius of curvature) of the second lens 72 in the first region AAs1 and the second region AAs2. In addition, the number of first lenses 71 overlapping the first light-emitting element 3-1 is different from the number of second lenses 72 overlapping the second light-emitting element 3-2. This configuration can make the distribution of light extracted from the light-emitting elements 3 different for each region in the display region AA. Specifically, the display device 1 can secure the luminance in the front direction in the first region AAs1 and secure the viewing angle in the second region AAs2.

As illustrated in FIG. 5, the semiconductor layer 31 of the light-emitting element 3 has a square shape in planar view. The embodiment is not limited thereto, and the semiconductor layer 31 may have other shapes, such as rectangular, polygonal, and circular shapes, in planar view. The number of second lenses 72 overlapping one second light-emitting element 3-2 is not limited to four and may be two, three, or five or more.

First Modification of the First Embodiment

Figure 7:
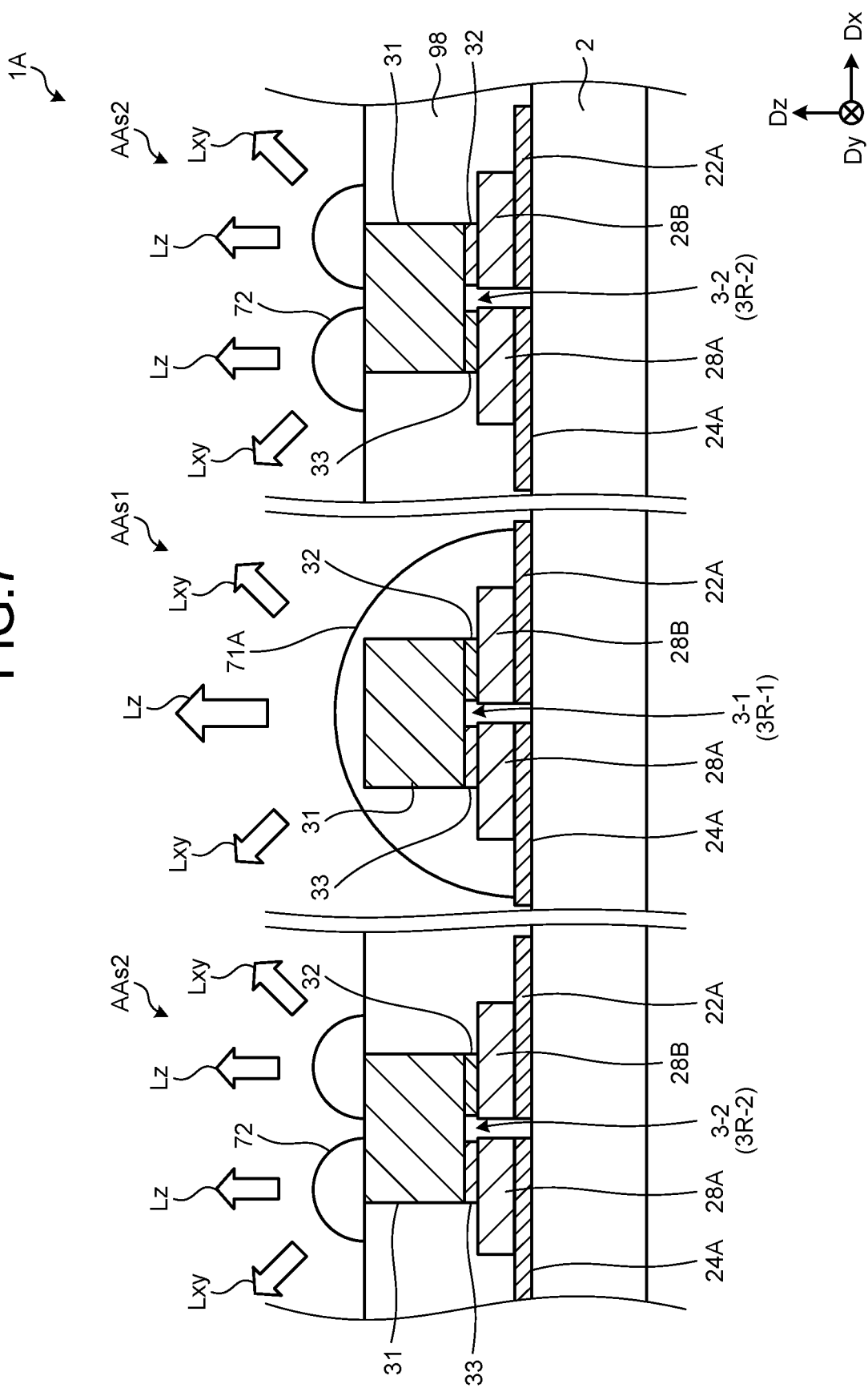
FIG. 7 is a sectional view schematically illustrating the first light-emitting element, the first lens, the second light-emitting elements, and the second lenses according to a first modification of the first embodiment.

FIG. 7 is a sectional view schematically illustrating the first light-emitting element, the first lens, the second light-emitting elements, and the second lenses according to a first modification of the first embodiment. In the following description, the same components as those described in the embodiment above are denoted by like reference numerals, and overlapping explanation thereof is omitted.

As illustrated in FIG. 7, the light-emitting element 3 in a display device 1A according to the first modification of the first embodiment is a flip-chip light-emitting element. The anode electrode 33 (p-type electrode) and the cathode electrode 32 (n-type electrode) are adjacently provided on the surface of semiconductor layer 31 facing the array substrate 2.

The anode electrode 33 is coupled to a first mounting electrode 24A on the array substrate 2 with a bonding member 28A interposed therebetween. The cathode electrode 32 is coupled to the first mounting electrode 24A on the array substrate 2 with the bonding member 28A interposed therebetween.

In the first region AAs1, a first lens 71A is provided covering the upper surface and the side surfaces of the first light-emitting element 3-1. The first lens 71A is provided also covering the bonding members 28A and 28B. In other words, the first lens 71A also functions as the element insulating film 98.

In the second region AAs2, the element insulating film 98 is provided covering the second light-emitting element 3-2. The second lenses 72 are provided on the element insulating film 98, overlapping the second light-emitting element 3-2. Also in the present modification, the first diameter D1 (refer to FIG. 5) of the first lens 71A is larger than the second diameter D2 (refer to FIG. 5) of the second lens 72 in planar view. The radius of curvature (height) of the first lens 71A is larger than the radius of curvature (height) of the second lens 72 and than the height of the first light-emitting element 3-1 in sectional view.

As described above, the first lens 71A and the second lens 72 may be provided in different layers. By providing the first lens 71A with a large radius of curvature on the array substrate 2 (more specifically, on the first mounting electrode 24A and a second mounting electrode 24B), the display device 1A can be made thinner than the display device 1 according to the first embodiment.

Second Modification of the First Embodiment

Figure 8:
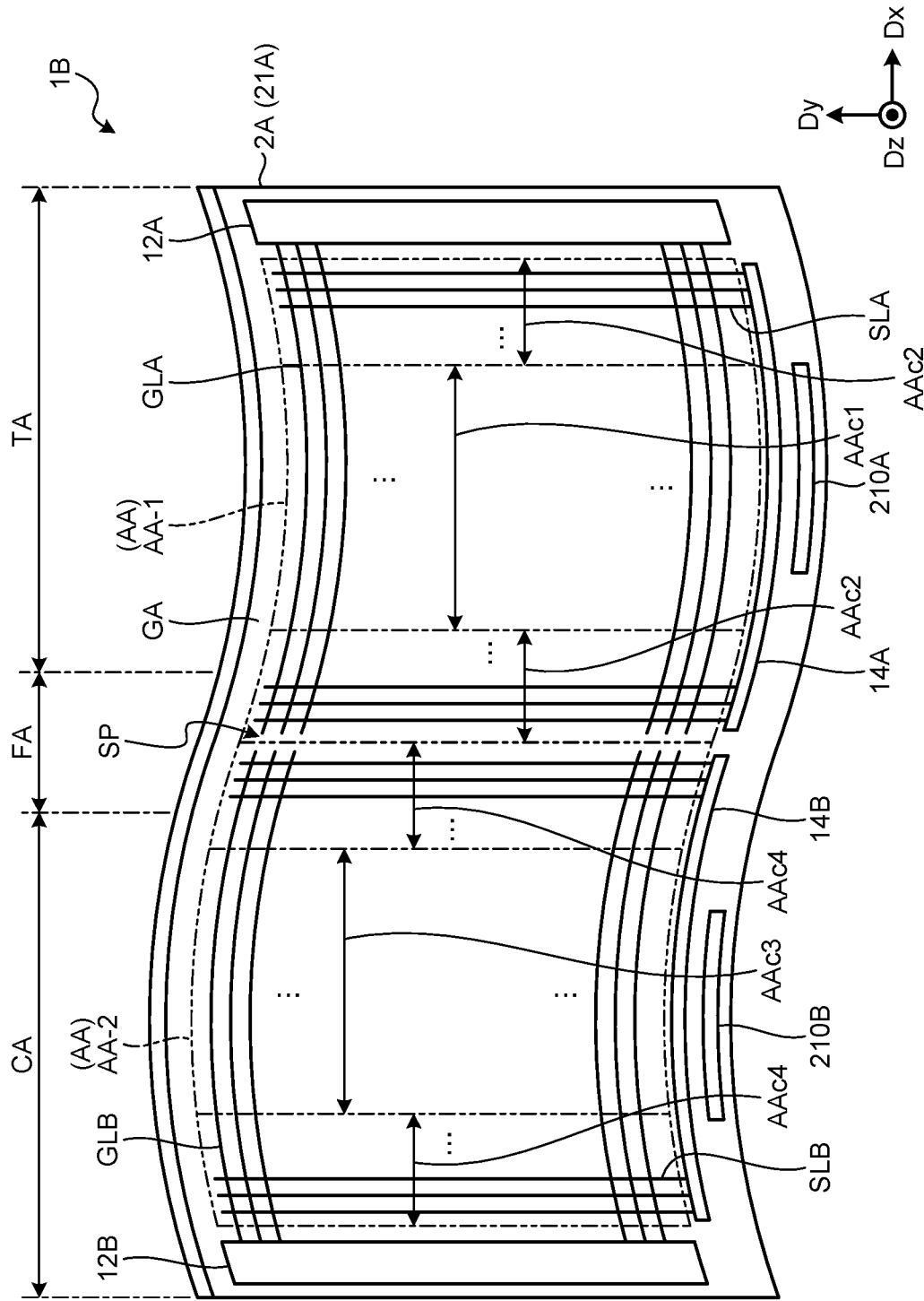
FIG. 8 is a perspective view schematically illustrating an array substrate included in the display device according to a second modification of the first embodiment.

FIG. 8 is a perspective view schematically illustrating the array substrate included in the display device according to a second modification of the first embodiment. While the substrate 21 according to the first embodiment and the first modification above has a flat plate shape, the embodiment is not limited thereto. As illustrated in FIG. 8, a display device 1B according to the second modification of the first embodiment is a curved surface display.

An array substrate 2A included in the display device 1B has a curved shape in the first direction Dx and a shape curved into an S-shape when viewed from the second direction Dy. The array substrate 2A has a first curved surface region TA, a second curved surface region CA, and a low-curvature region FA.

The first curved surface region TA has a curved surface protruding toward the display surface. The second curved surface region CA has a curved surface recessed toward the opposite side of the first curved surface region TA. The first curved surface region TA and the second curved surface region CA are each curved with a constant curvature. The first curved surface region TA and the second curved surface region CA may have the same curvature or different curvatures. The first curved surface region TA and the second curved surface region CA do not necessarily have a constant curvature and may have different curvatures along the first direction Dx.

The low-curvature region FA is arranged between the first curved surface region TA and the second curved surface region CA in the first direction Dx. The low-curvature region FA is a region having a curvature smaller than that of the first curved surface region TA and the second curved surface region CA. In other words, the low-curvature region FA is a region having no curved part and smoothly coupling the first curved surface region TA and the second curved surface region CA.

The display region AA includes a first display region AA-1 and a second display region AA-2. The first display region AA-1 and the second display region AA-2 are adjacently arranged in the first direction Dx. Specifically, the first display region AA-1 is a region overlapping the first curved surface region TA and part of the low-curvature region FA adjacent to the first curved surface region TA. The second display region AA-2 is a region overlapping the second curved surface region CA and part of the low-curvature region FA adjacent to the second curved surface region CA.

While the display region AA is formed into an approximately rectangular shape when viewed from the third direction Dz, the outer shape of the display region AA is not limited thereto. The display region AA may have a cut-off part, for example. Alternatively, the display region AA may be formed into other polygonal shapes or other shapes, such as circular and elliptic shapes. The first display region AA-1 and the second display region AA-2 are not necessarily continuously provided to display one image and may be separately provided to display different images.

The first display region AA-1 includes a first region AAc1 and second regions AAc2. The first region AAc1 is positioned at the center of the first display region AA-1 in the first direction Dx. The first region AAc1 is provided between the second regions AAc2 in the first direction Dx. In the first display region AA-1, the second region AAc2, the first region AAc1, and the second region AAc2 are arranged in this order in the first direction Dx.

The second display region AA-2 includes a third region AAc3 and fourth regions AAc4. The third region AAc3 is positioned at the center of the second display region AA-2 in the first direction Dx. The third region AAc3 is provided between the fourth regions AAc4 in the first direction Dx. In the second display region AA-2, the fourth region AAc4, the third region AAc3, and the fourth region AAc4 are arranged in this order in the first direction Dx. The fourth region AAc4 and the second region AAc2 are adjacently arranged in the low-curvature region FA.

The first region AAc1 and the third region AAc3 are regions in which the normal direction of the array substrate 2A (substrate 21A) is directed in the front direction and are provided with the first light-emitting elements 3-1 and the first lenses 71 (or the first lenses 71A) described above. The second region AAc2 and the fourth region AAc4 are regions in which the normal direction of the array substrate 2A (substrate 21A) is directed in a direction inclined with respect to the front direction and are provided with the second light-emitting elements 3-2 and the second lenses 72 described above.

With this configuration, light output from the first light-emitting elements 3-1 is collected by the first lenses 71 (or the first lenses 71A) in the first region AAc1 and the third region AAc3, thereby improving the luminance in the front direction. In the second region AAc2 and the fourth region AAc4, part of light output from the second light-emitting elements 3-2 travels in the front direction through the second lenses 72. Thus, the luminance in the front direction is improved in the second region AAc2 and the fourth region AAc4 compared with a case where the second lenses 72 are not provided.

The array substrate 2A includes first gate lines GLA, second gate lines GLB, first signal lines SLA, second signal lines SLB, a first gate line drive circuit 12A, a second gate line drive circuit 12B, a first signal line drive circuit 14A, a second signal line drive circuit 14B, a first drive IC 210A, and a second drive IC 210B.

The first gate lines GLA and the first signal lines SLA are provided in the first display region AA-1. The first gate lines GLA are curved into a protruding shape along the shape of the first curved surface region TA and the low-curvature region FA. The first gate lines GLA are coupled to the first gate line drive circuit 12A. The first signal lines SLA extend in the second direction Dy and are coupled to the first signal line drive circuit 14A. The first drive IC 210A is mounted in a region between the first signal line drive circuit 14A and the end of the array substrate 2A.

The second gate lines GLB and the second signal lines SLB are provided in the second display region AA-2. The second gate lines GLB are curved into a recessed shape along the shape of the second curved surface region CA and the low-curvature region FA. The second gate lines GLB are coupled to the second gate line drive circuit 12B. The second signal lines SLB extend in the second direction Dy and are coupled to the second signal line drive circuit 14B. The second drive IC 210B is mounted in a region between the second signal line drive circuit 14B and the end of the array substrate 2A.

The configuration of the first gate lines GLA, the second gate lines GLB, the first signal lines SLA, the second signal lines SLB, and various peripheral circuits is given by way of example only and may be appropriately modified. The first gate line GLA and the second gate line GLB, for example, may be continuously formed across the first display region AA-1 and the second display region AA-2. The array substrate 2A (substrate 21A) does not necessarily have a shape curved into an S-shape and may simply be curved in a protruding or recessed shape.

Second Embodiment

Figure 9:
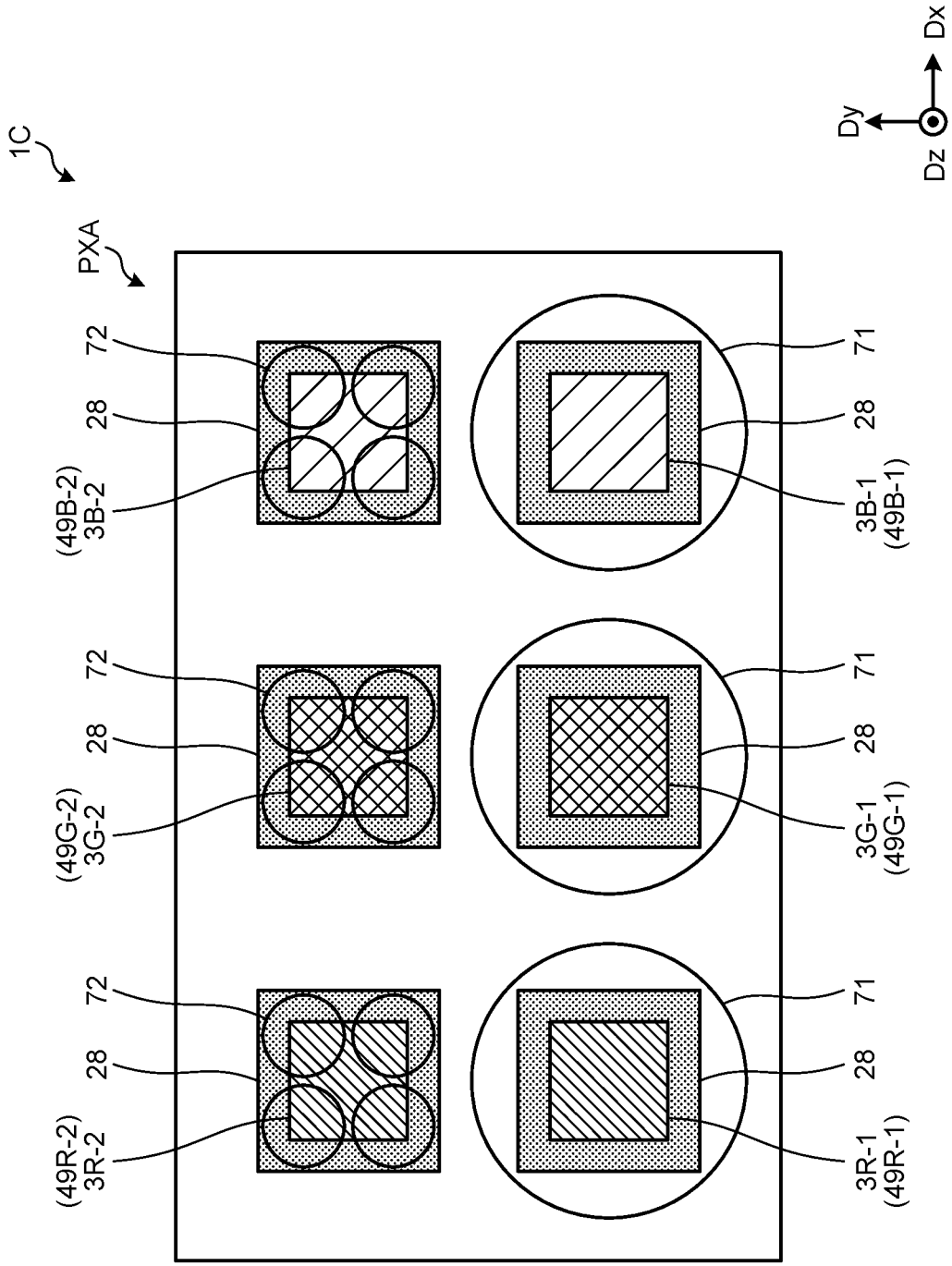
FIG. 9 is a plan view schematically illustrating the first light-emitting elements, the first lenses, the second light-emitting elements, and the second lenses included in one pixel of the display device according to a second embodiment.
Figure 10:
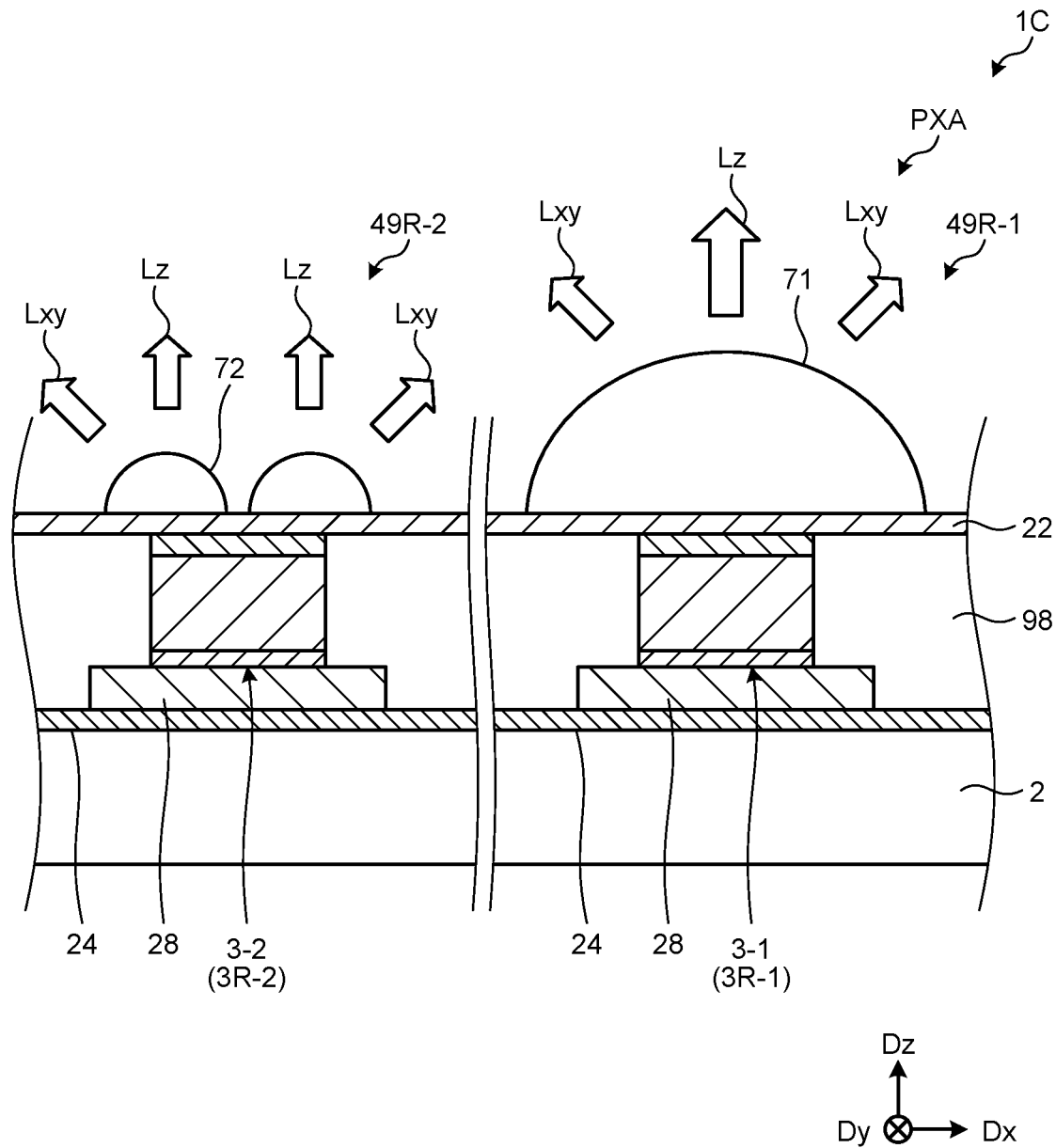
FIG. 10 is a sectional view schematically illustrating the first light-emitting element, the first lens, the second light-emitting element, and the second lenses included in one pixel of the display device according to the second embodiment.

FIG. 9 is a plan view schematically illustrating the first light-emitting elements, the first lenses, the second light-emitting elements, and the second lenses included in one pixel of the display device according to a second embodiment. FIG. 10 is a sectional view schematically illustrating the first light-emitting element, the first lens, the second light-emitting element, and the second lenses included in one pixel of the display device according to the second embodiment. FIG. 10 schematically illustrates the first light-emitting element 3R-1 and the second light-emitting element 3R-2 arrayed in the second direction Dy in a manner adjacent to each other.

In the configuration according to the first embodiment above, the first light-emitting elements 3-1 and the first lenses 71 (or the first lenses 71A) are arrayed in the first region AAs1, and the second light-emitting elements 3-2 and the second lenses 72 are arrayed in the second region AAs2 in the display region AA. The embodiment, however, is not limited thereto.

As illustrated in FIGS. 9 and 10, one pixel PXA in a display device 1C according to the second embodiment includes the first light-emitting elements 3R-1, 3G-1, and 3B-1 and the second light-emitting elements 3R-2, 3G-2, and 3B-2. The first light-emitting elements 3R-1, 3G-1, and 3B-1 are arrayed in the first direction Dx. The second light-emitting elements 3R-2, 3G-2, and 3B-2 are arrayed in the first direction Dx and are disposed adjacently to the first light-emitting elements 3R-1, 3G-1, and 3B-1 in the second direction Dy. In FIG. 9, the first light-emitting element 3-1 (e.g., the first light-emitting element 3R-1) and the second light-emitting element 3-2 (e.g., the second light-emitting element 3R-2) that output light in the same color are adjacently disposed in the second direction Dy.

The first lens 71 is provided overlapping each of the first light-emitting elements 3R-1, 3G-1, and 3B-1 in planar view. The second lenses 72 are provided overlapping each of the second light-emitting elements 3R-2, 3G-2, and 3B-2. In other words, one first lens 71 and the second lenses 72 are adjacently disposed in the second direction Dy.

Specifically, in one pixel PXA according to the present embodiment, a first sub-pixel 49-1 including the first light-emitting element 3-1 and the first lens 71 and a second sub-pixel 49-2 including the second light-emitting element 3-2 and the second lenses 72 are adjacently disposed in the second direction Dy. The pixels PXA each include a total of six sub-pixels 49 of the first sub-pixels 49-1 and the second sub-pixels 49-2 as a set and are arrayed in a matrix (row-column configuration) in the display region AA.

The multilayered structure of the first light-emitting element 3R-1, the first lens 71, the second light-emitting element 3R-2, and the second lens 72 is the same as that according to the first embodiment above, and repeated explanation thereof is omitted. The relation between the first diameter D1 of the first lens 71, the second diameter D2 of the second lens 72, and the width of the light-emitting elements 3 is the same as that according to the first embodiment.

Figure 11:
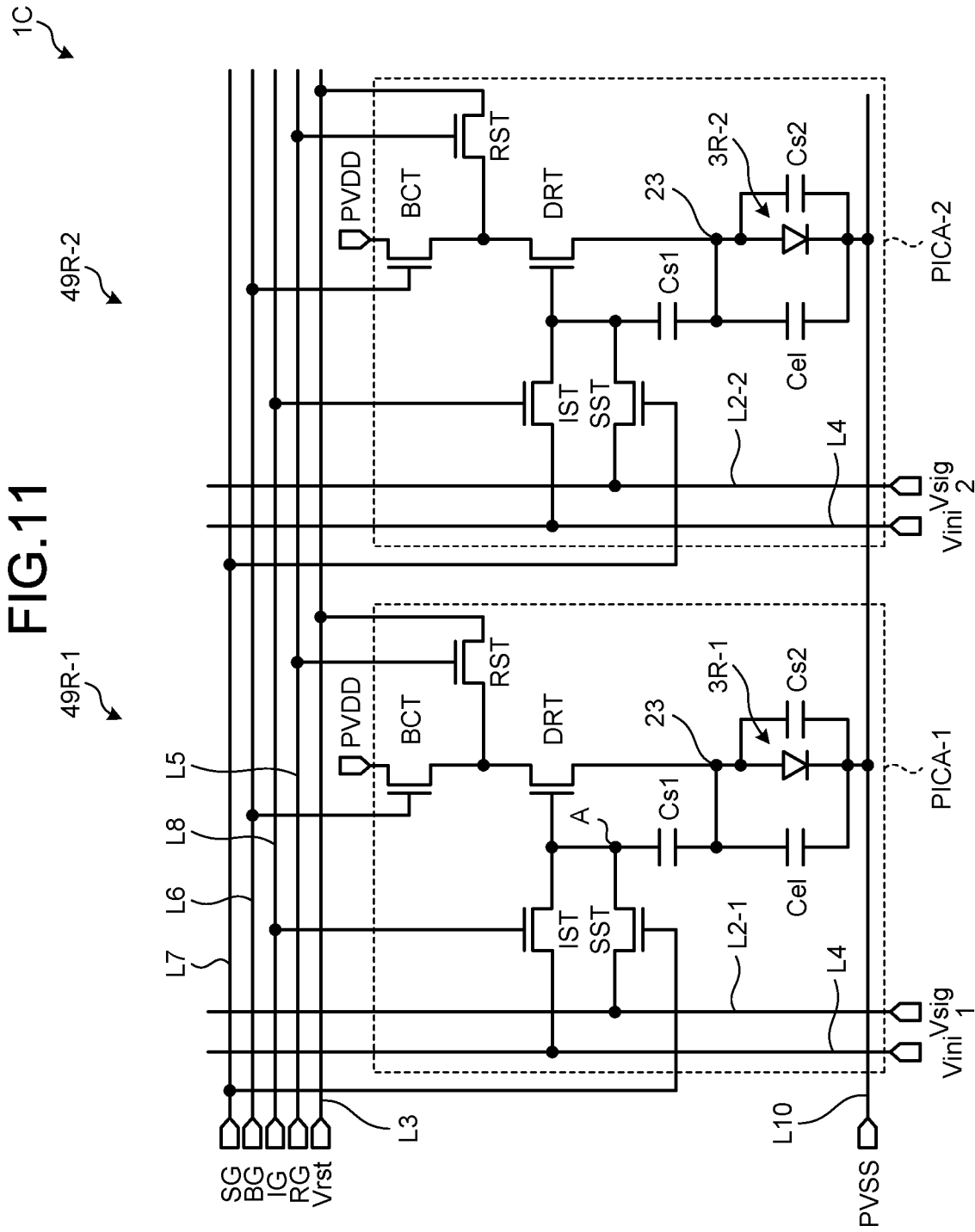
FIG. 11 is a circuit diagram of the pixel circuit according to the second embodiment.

FIG. 11 is a circuit diagram of the pixel circuits according to the second embodiment. As illustrated in FIG. 11, a first pixel circuit PICA-1 is provided corresponding to the first light-emitting element 3R-1. A second pixel circuit PICA-2 is provided corresponding to the second light-emitting element 3R-2. The first pixel circuit PICA-1 and the second pixel circuit PICA-2 are adjacently provided and share part of the wiring. While FIG. 11 illustrates the pixel circuits PICA of the first light-emitting element 3R-1 and the second light-emitting element 3R-2, the pixel circuits PICA are also provided to the first light-emitting elements 3G-1 and 3B-1 and the second light-emitting elements 3G-2 and 3B-2.

Specifically, the reset power supply line L3, the reset control signal line L5, the output control signal line L6, the pixel control signal line L7, the initialization control signal line L8, and the cathode power supply line L10 are coupled to the first pixel circuit PICA-1 and the second pixel circuit PICA-2. The configuration of the first pixel circuit PICA-1 and the second pixel circuit PICA-2 is similar to that of the pixel circuit PICA illustrated in FIG. 3. The configuration of the first pixel circuit PICA-1 and the second pixel circuit PICA-2 is different from that of the pixel circuit PICA in that the reset transistor RST is coupled between the output transistor BCT and the drive transistor DRT.

With this configuration, the display device 1C according to the second embodiment can improve the luminance in the front direction by the first light-emitting elements 3-1 and the first lenses 71 of the first sub-pixels 49-1 and secure a wider viewing angle by the second light-emitting elements 3-2 and the second lenses 72 of the second sub-pixels 49-2 in one pixel PXA. The display device 1C may control lighting and non-lighting of the first light-emitting elements 3-1 and the second light-emitting elements 3-2 in the pixels PXA arrayed in a matrix (row-column configuration) in the display region AA for each region.

Third Modification of the Second Embodiment

Figure 12:
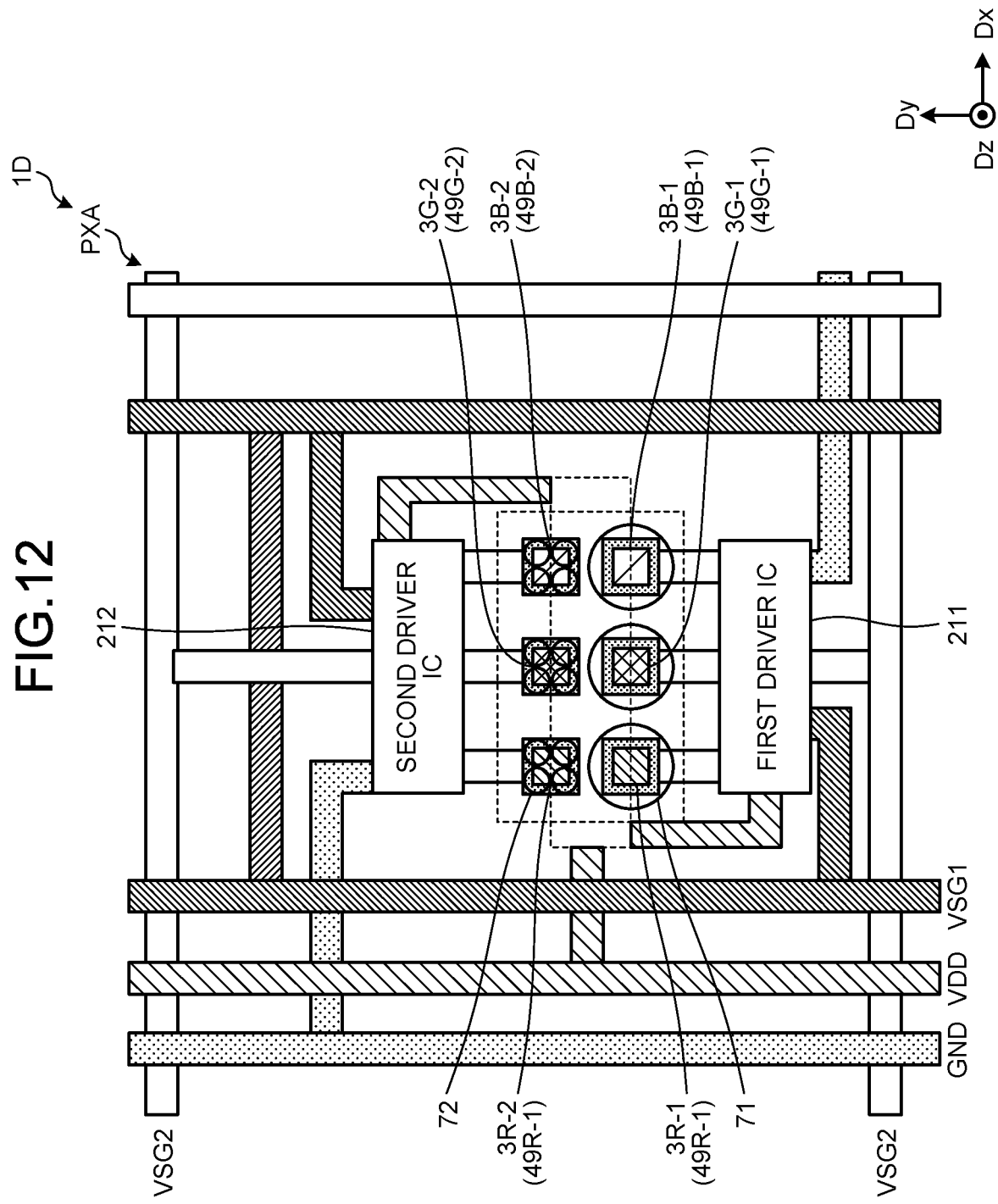
FIG. 12 is a plan view schematically illustrating the pixel according to a third modification of the second embodiment.

FIG. 12 is a plan view schematically illustrating the pixel according to a third modification of the second embodiment. As illustrated in FIG. 12, the pixel PXA in a display device 1D according to the third modification of the second embodiment further includes a first driver IC 211 and a second driver IC 212. The first driver IC 211 and the second driver IC 212 are also called micro ICs.

The first driver IC 211 is a circuit that drives the first light-emitting elements 3R-1, 3G-1, and 3B-1. The second driver IC 212 is a circuit that drives the second light-emitting elements 3R-2, 3G-2, and 3B-2. A pair of the first driver IC 211 and the second driver IC 212 is mounted on each of the pixels PXA. In other words, the first driver IC 211 and the second driver IC 212 have the functions of the first pixel circuit PICA-1 and the second pixel circuit PICA-2, respectively, illustrated in FIG. 11. The first driver IC 211 and the second driver IC 212 may have some of the functions of the first pixel circuit PICA-1 and the second pixel circuit PICA-2 illustrated in FIG. 11, and other functions may be implemented by the transistors on the array substrate 2.

The third modification of the second embodiment requires less transistors on the array substrate 2.

Third Embodiment

Figure 13:
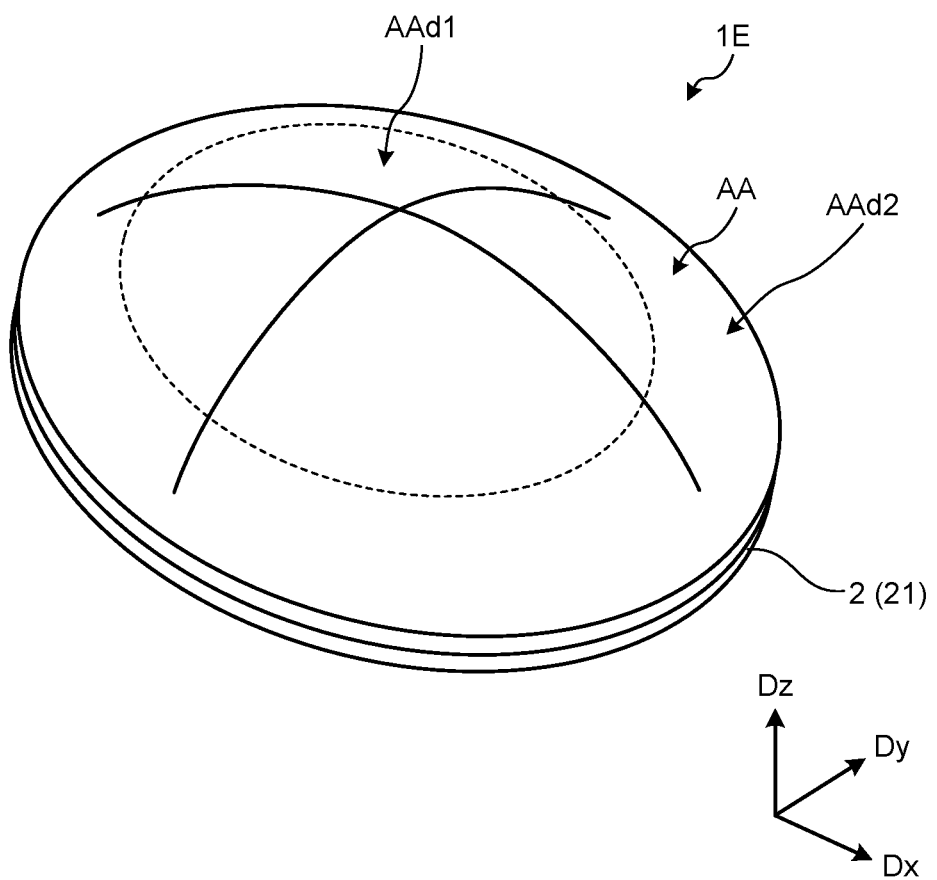
FIG. 13 is a perspective view schematically illustrating the display device according to a third embodiment.

FIG. 13 is a perspective view schematically illustrating the display device according to a third embodiment. As illustrated in FIG. 13, in a display device 1E according to the third embodiment, the main surface of the substrate 21 on which the light-emitting elements 3 are mounted has a shape curved to protrude. More specifically, the array substrate 2 (substrate 21) of the display device 1E has a shape curved to protrude both in a sectional structure in the first direction Dx and in a sectional structure in the second direction Dy intersecting the first direction Dx.

The configurations according to the embodiments and the modifications above are also applicable to the present embodiment. The display region AA of the substrate 21, for example, includes a first region AAd1 and a second region AAd2. The first region AAd1 is provided at the center of the display region AA, and the second region AAd2 is provided at the outer end of the display region AA. The first region AAd1 is provided with the first light-emitting elements 3-1 and the first lenses 71. The second region AAd2 is provided with the second light-emitting elements 3-2 and the second lenses 72.

Alternatively, the array substrate 2 (substrate 21) according to the third embodiment may be combined with the configuration of the pixel PXA according to the second embodiment.

While exemplary embodiments according to the present disclosure have been described, the embodiments are not intended to limit the disclosure. The contents disclosed in the embodiments are given by way of example only, and various modifications may be made without departing from the spirit of the present disclosure. Appropriate modifications made without departing from the spirit of the present disclosure naturally fall within the technical scope of the disclosure. At least one of various omissions, substitutions, and modifications of the components may be made without departing from the gist of the embodiments above and the modification thereof.

What is claimed is:

1. A display device comprises:
  a substrate;
  a plurality of first light-emitting elements and a plurality of second light-emitting elements provided in a display region of the substrate;
  a first lens provided overlapping each of the first light-emitting elements and having a first diameter in planar view seen from a first direction perpendicular to the substrate; and
  a second lens provided overlapping each of the second light-emitting elements and having a second diameter smaller than the first diameter in planar view seen from the first direction, wherein
  the first diameter of the first lens is larger than a first width of the first light-emitting element, and
  the second diameter of the second lens is smaller than a second width of the second light-emitting element.

2. The display device according to claim 1, wherein
  the first lens is provided overlapping each of the first light-emitting elements, and
  a plurality of the second lens are provided overlapping each of the second light-emitting elements.

3. The display device according to claim 1, wherein
  the display region of the substrate includes a first region provided with the first light-emitting elements and a plurality of the first lenses and a second region provided with the second light-emitting elements and a plurality of the second lenses, and
  the first region is provided at a center of the display region, and the second region is provided at an outer end of the display region in a second direction.

4. The display device according to claim 1, further comprising:
  a plurality of pixels arrayed on the substrate, wherein
  each of the pixels includes the first light-emitting elements and the second light-emitting elements, and
  the first light-emitting element and the first lens and the second light-emitting element and a plurality of the second lenses are adjacently disposed in planar view seen from the first direction.

5. The display device according to claim 4, wherein the first light-emitting element and the second light-emitting element adjacent to each other in each of the pixels output light in the same color.

6. The display device according to claim 4, wherein each of the pixel includes a first driver IC configured to drive the first light-emitting elements and a second driver IC configured to drive the second light-emitting elements.

7. The display device according to claim 1, further comprising:
  an element insulating film covering a side surface of the first light-emitting elements and the second light-emitting elements, wherein
  the first lens and the second lens are provided on the element insulating film.

8. The display device according to claim 1, further comprising:
  an element insulating film covering a side surface of the second light-emitting elements, wherein
  the first lens is provided on the substrate to cover an upper surface and a side surface of the first light-emitting element, and
  the second lens is provided on the element insulating film.

9. The display device according to claim 1, wherein
  the substrate has such a curved shape that a main surface on which the first light-emitting elements and the second light-emitting elements are mounted is curved to protrude,
  the display region of the substrate includes a first region provided with the first light-emitting elements and a plurality of the first lenses and a second region provided with the second light-emitting elements and a plurality of the second lenses, and
  the first region is provided at a center of the display region of the substrate, and the second region is provided at an outer end of the display region of the substrate.

* * * * *